United States Patent
Zhao et al.

(10) Patent No.: US 9,866,220 B2
(45) Date of Patent: Jan. 9, 2018

(54) TIMING DEVICE

(71) Applicant: Shenyang Neusoft Medical Systems Co., Ltd., Shenyang (CN)

(72) Inventors: Yuqiu Zhao, Shenyang (CN); Guodong Liang, Shenyang (CN); Long Yang, Shenyang (CN); Peng Gao, Shenyang (CN); Jun Zhang, Shenyang (CN)

(73) Assignee: SHENYANG NEUSOFT MEDICAL SYSTEMS CO., LTD., Shenyang (CN)

( * ) Notice: Subject to any disclaimer, the term of this patent is extended or adjusted under 35 U.S.C. 154(b) by 0 days.

(21) Appl. No.: 15/369,848

(22) Filed: Dec. 5, 2016

(65) Prior Publication Data

US 2017/0163262 A1 Jun. 8, 2017

(30) Foreign Application Priority Data

Dec. 8, 2015 (CN) .......................... 2015 1 0897299

(51) Int. Cl.
*H03K 21/00* (2006.01)
*H03K 23/00* (2006.01)

(52) U.S. Cl.
CPC .................................. *H03K 23/005* (2013.01)

(58) Field of Classification Search
CPC .................................................... H03K 23/005
See application file for complete search history.

(56) References Cited

U.S. PATENT DOCUMENTS

| | | | |
|---|---|---|---|
| 2003/0048699 A1 | 3/2003 | Otto | |
| 2006/0129350 A1* | 6/2006 | West | G04F 10/04 |
| | | | 702/176 |
| 2009/0125263 A1 | 5/2009 | Zurbuchen et al. | |
| 2015/0220065 A1 | 8/2015 | Suma Vinay et al. | |

FOREIGN PATENT DOCUMENTS

CN 103345144 A 10/2013

* cited by examiner

*Primary Examiner* — Daniel Puentes
(74) *Attorney, Agent, or Firm* — Kilpatrick Townsend & Stockton LLP

(57) ABSTRACT

A timing method and a timing device are disclosed. A Gray code count output may be obtained by performing a Gray code count on a basic clock. Then m number of sub-clocks may be obtained by separately performing a phase shift on a least significant bit output of the Gray code count output, where a phase difference $\varphi$ between each of the m number of sub-clocks and the least significant bit output may satisfy: $\varphi = n \times \alpha$ and $\varphi \neq 90°$, $180°$ may be divisible by $\alpha$ with no remainder, and n may be an integer greater than 0 and less than $180°/\alpha$. If $90°$ is divisible by $\alpha$ with no remainder, $m = 180/\alpha - 2$; and if $90°$ is divisible by $\alpha$ with a remainder, $m = 180/\alpha - 1$. When a predetermined event occurs, a timing result of the predetermined event may be obtained according to the Gray code count output value, outputs of the m number of sub-clocks, a period of the basic clock, and the $\alpha$.

12 Claims, 4 Drawing Sheets

TIMING DEVICE

BACKGROUND

The present disclosure is directed to timing.

In many electronic systems, a timing procedure may be performed on a predetermined event. For example, in a PET (Positron Emission Computed Tomography) system, a timing procedure may be performed on an arrival time of two photons at a detector, and the timing result may be used to determine whether the two events are a pair of coincidence events, such that a PET image may be reconstructed according to the coincidence events.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

BRIEF DESCRIPTION OF DRAWINGS

The details of one or more embodiments of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Performing a timing operation on a predetermined event may mean that a time interval from a start time to an occurrence time of the predetermined event may be obtained. The time interval may be used as a timing result.

Figure 1:
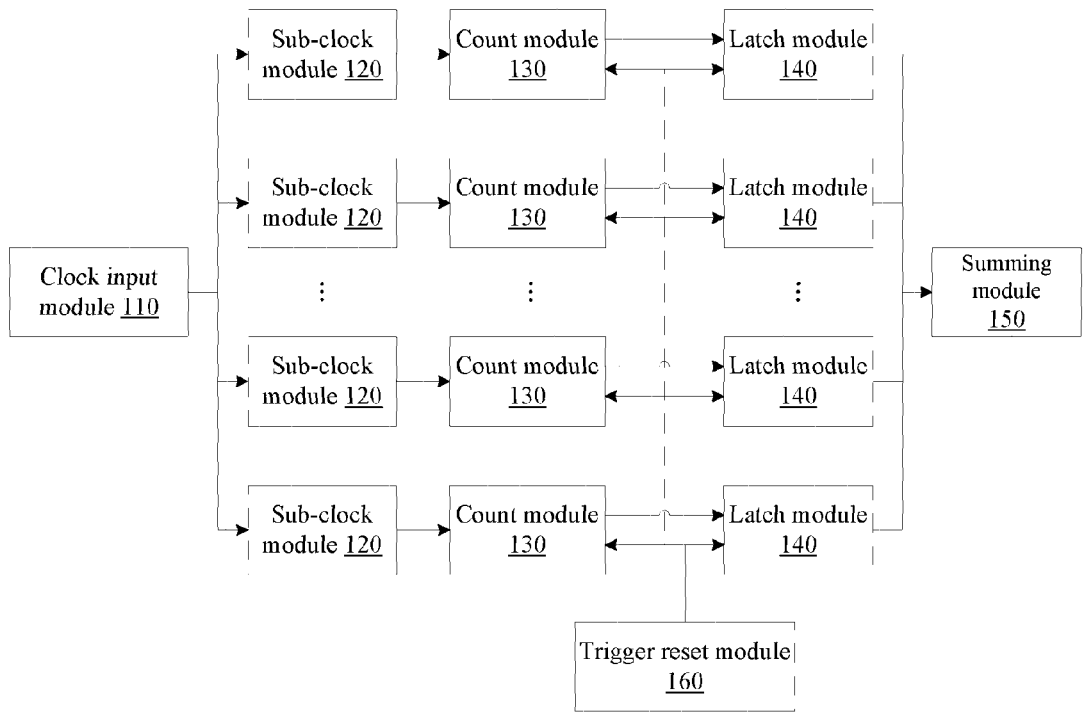
FIG. 1 is an architecture diagram of a timing device.

Referring to FIG. 1, which is an architecture diagram of a timing device. A common timing procedure may include the following steps. A clock input module 110 may output a basic clock, and m number of sub-clock modules 120 may separately perform a phase shift on the basic clock so as to obtain m number of sub-clocks, where phase differences between adjacent sub-clocks may be the same. Each of count modules 130 may separately correspond to one sub-clock module 120 and one latch module 140, and each of the count modules 130 may perform a count on its corresponding sub-clock. When the timing operation is started, a trigger reset module 160 may clear all of the count modules 130 and the latch modules 140 to zero. When a predetermined event occurs, each of the latch modules 140 may separately latch its corresponding count result. A summing module 150 may perform a summing operation on count results latched by all of the latch modules 140, which may obtain a timing result of the predetermined event according to a summing result and the phase differences between adjacent sub-clocks.

According to an example, the timing result may be expressed as follows:

$$Z \times t_0 \times \beta/360°.$$

Here, Z may indicate the summing result, $\beta$ may indicate the phase differences between adjacent sub-clocks, and $t_0$ may indicate a period of the basic clock.

In the timing method above, each of the sub-clock modules 120 may correspond to one count module 130. For example, if twenty sub-clock modules 120 are employed, twenty count modules 130 may be required. Such a number of the count modules 130 may be too large, and may cause a waste of hardware resources.

An original binary count may be adopted by each of the count modules 130. Simultaneous transitions may occur at a plurality of bit outputs of the timing result, which may cause the count result of the latch module 140 incorrect, thereby affecting the accuracy of the timing procedure.

A timing method may be provided in an example in accordance with the disclosure, which may reduce the number of the count modules 130 and avoid simultaneous transitions which may occur at a plurality of outputs, thereby effectively reducing the waste of hardware resources and improving the accuracy of the timing procedure.

Figure 2:
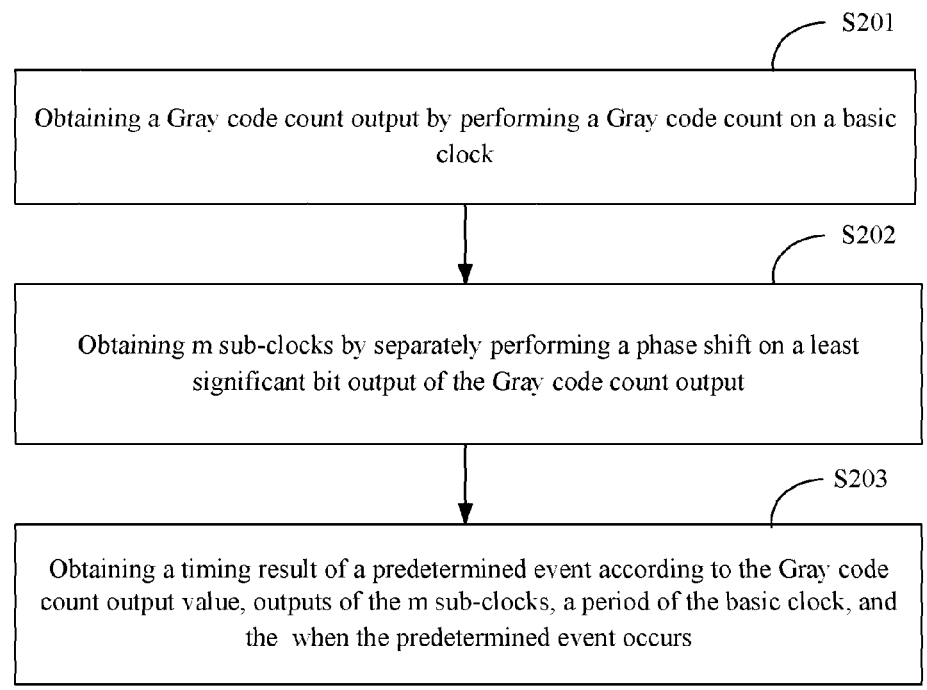
FIG. 2 is a flowchart illustrating an operating procedure of a timing method according to an example in accordance with the disclosure.

Referring to FIG. 2, which is a flowchart illustrating an operating procedure of a timing method according to an example in accordance with the disclosure. The method may include the following blocks S201-S203.

At block S201, a Gray code count output may be obtained by performing a Gray code count on a basic clock.

Figure 3:
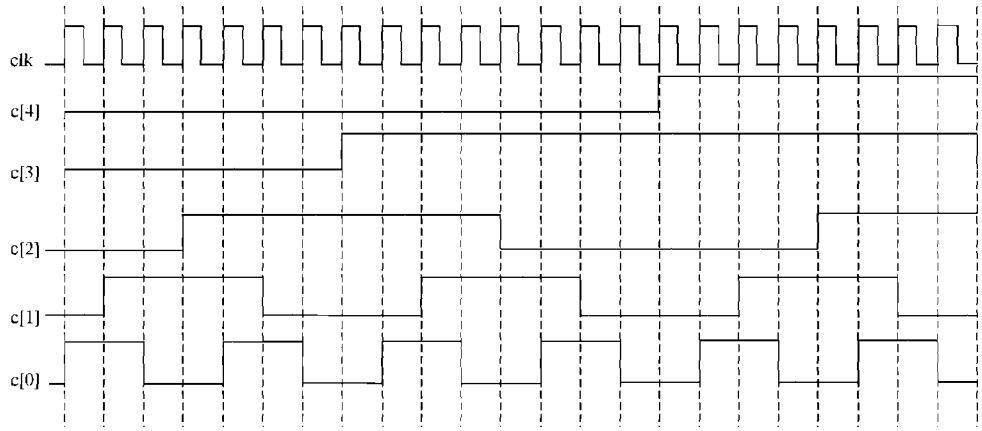
FIG. 3 is a waveform diagram showing waveforms of a basic clock and a Gray code count output.

In an example, the original binary count may not be adopted, but the Gray code count may be adopted so as to obtain the Gray code count output, thereby ensuring that simultaneous transitions won't occur at a plurality of bit outputs of the Gray code count. For example, a Gray code count output is shown in FIG. 3. FIG. 3 is a waveform diagram showing waveforms of a basic clock and a Gray code count output, where clk may indicate the basic clock, c[0], c[1], c[2], c[3], and c[4] may respectively indicate a $0^{th}$ bit output, a $1^{st}$ bit output, a $2^{nd}$ bit output, a $3^{rd}$ bit output, and a $4^{th}$ bit output of the Gray code count output.

In an example, the basic clock may be a clock signal obtained by performing a frequency multiplication on an original clock. Whether a frequency multiplication is required or not may be determined according to timing accuracy. The original clock may be obtained by the clock input module 110.

In an example, a number of bits in the Gray code count output may determine a maximum timing length. In particular, the maximum timing length of the timing method may get longer if the number of bits in the Gray code count output gets bigger. Two alternative methods of generating the Gray code count output may be provided below.

The first method of generating the Gray code count output may be that an original binary count may be performed on the basic clock so as to obtain an original binary count output, and then the original binary count output may be converted into the Gray code count output. A converting method of converting the original binary count output into the Gray code count output may be GC=BC^(BC>>1), where BC may indicate the original binary count output, GC may indicate the Gray code count output, "^" may indicate an "XOR" operation, and ">>" may indicate a right shift operation.

The second method of generating the Gray code count output involve a frequency division and a delay may be performed on the basic clock so as to obtain the Gray code count output.

Here, a frequency division may be performed on the basic clock so as to obtain a plurality of frequency division outputs, and then a delay may be performed on the plurality of frequency division outputs so as to obtain the Gray code count output.

For example, it may be assumed that the bit number of the Gray code count output is j. The specific frequency division method may be that: when $0 \leq k \leq j-1$, a frequency division number outputted by the $k^{th}$ output among the plurality of frequency division outputs may be expressed by $f_k=4 \times 2^k$. For example, the period of the $k^{th}$ output among the plurality of frequency division outputs may be $4 \times 2^k$ times of the period of the basic clock. When $k=j-1$, the frequency division number outputted by the $k^{th}$ output among the plurality of frequency division outputs may be expressed by $f_k=4 \times 2^{k-1}$, which may have the same frequency number as the previous frequency division output.

A specific delay implementation may be that: when $0<k \leq j-1$, a delay having $q_k$ periods of the basic clock may be performed on the $k^{th}$ output among the plurality of frequency division outputs so as to obtain the $k^{th}$ bit output of the Gray code count, where $q_k=q_{k-1}+f_{k-1}/4$, $q_{k-1}$ may indicate the number of periods of the basic clock of the delay performed on the $(k-1)^{th}$ bit output of the Gray code count, and $f_{k-1}$ may indicate the frequency division number outputted by the $(k-1)^{th}$ output among the plurality of frequency division outputs. When $k=0$, $q_k=0$.

For example, 4 frequency divisions, 8 frequency divisions, 16 frequency divisions, 32 frequency divisions, and 64 frequency divisions may be separately performed on the basic clock so as to obtain 5 frequency division outputs. A delay may be then performed on the 5 frequency division outputs so as to obtain the Gray code count output shown in FIG. 3. When performing the frequency divisions on the basic clock, the following methods may be adopted so as to obtain the 5 frequency division outputs d[0], d[1], d[2], d[3], and d[4]. Where the frequency division number of d[1] may be 4, the frequency division number of d[2] may be 8, the frequency division number of d[3] may be 16, and the frequency division number of d[4] may be 32.

$d[0]=!d[0];$ $d[1]=d[0]\char`\^d[1];$ $d[2]=(d[0]\&d[1])\char`\^d[2];$ $d[3]=(d[0]\&d[1]\&d[2])\char`\^d[3];$ $d[4]=(d[0]\&d[1]\&d[2]\&d[3])\char`\^d[4];$ and $d[5]=(d[0]\&d[1]\&d[2]\&d[3]\&d[4])\char`\^d[5].$ Here, "!" may indicate a "NOT" operation, "&" may indicate an "AND" operation, and "^" may indicate an "XOR" operation. When obtaining d[0] based on the above-mentioned method, it may be specifically implemented by inputting the basic clock to a clock input end of a D flip-flop and connecting an output end of the D flip-flop to the input end of the D flip-flop via a "NOT" gate, where the output of the "NOT" gate may be d[0]. Similarly, based on the above-described manner, a combination of "AND" gates, D flip-flops, and "XOR" gates may be adopted for obtaining d[1], d[2], d[3], and d[4], and further description may be omitted here for brevity.

At block S202, m number of sub-clocks may be obtained by separately performing a phase shift on a least significant bit of the Gray code count output.

Here, the least significant bit output of the Gray code count output may be equal to the $0^{th}$ bit output of the Gray code count output, such as c[0] shown in FIG. 3.

For the sake of brevity, the phase shift of the least significant bit is used herein to explain the present disclosure. As can be known from the character of the Gray code, other bits in the Gray code count output may be used for the frequency division of the least significant bit. For example, c[1] may be used for a second frequency division of c[0]. A phase shift may be performed on one of the bits so as to obtain a plurality of sub-clocks, which may be consistent with the design conception of the present disclosure, and may belong to the claim scope of the present disclosure.

When performing a phase shift, a phase shift with 0, α, 2α, . . . , 180° degrees may be separately performed on the least significant bit of the Gray code count output, so as to obtain 180°/φ+1 sub-clocks, where 180° may be divisible by α with no remainder. As can be known from characteristics of Gray code, the period of the least significant bit output may be four times the period of the basic clock. Whenever an output value of the Gray code count is changed by 1, the phase variation of the corresponding least significant bit output may be 90°. The output value of the Gray code count may distinguish phase shifts 0°, 90°, 180° and other phase differences of the least significant bit output, and thus the sub-clocks for these three phase differences may be not required in this example.

Therefore, in an example, the phase difference φ between each of the sub-clocks among the m number of sub-clocks and the least significant bit output may satisfy: φ=n×α and φ≠90°, where n may be an integer satisfying 0<n<(180°/φ).

If 90° is divisible by a with no remainder, the number m of the sub-clocks may be determined as: m=180/α−2.

If 90° is divisible by a with a remainder, the number m of the sub-clocks may be determined as: m=180/α−1.

In an example, it may ensure that an edge overlap problem won't occur in the outputs of the m number of sub-clocks and the Gray code count output, e.g., simultaneous transitions won't occur.

For example, it may assume α=18°. In an example, the phase differences between the m number of sub-clocks and the least significant bit output may be 18°, 36°, 54°, 72°, 108°, 126°, 144° and 162°, respectively. Be noted that, the output value of the Gray code count corresponding to the phase difference 72° may be different from the output value of the Gray code count corresponding to the phase difference 90°. For example, the output value of the Gray code count corresponding to the phase difference 72° may be 0, while the output value of the Gray code count corresponding to the phase difference 90° may be 1. The phase difference 72° may be distinguished from the phase difference 90° based on the output values of the Gray code count, and thus there may be no need to generate the sub-clock for the phase difference 90°. Based on similar reasons, there may be no need to generate the sub-clocks for the phase differences 0° and 180°, thereby effectively reducing the number of the sub-clocks.

The timing accuracy (e.g., the minimum timing unit) in an example may be related to the phase shift angle, where the timing accuracy Δt may specifically be $\Delta t = t_0 \times \alpha/90°$, where $t_0$ may be the period of the basic clock.

The delay method may be used to implement phase shift. In particular, a delay with $T_0 \times \varphi/90°$ may be separately performed on the basic clock so as to obtain the m number of sub-clocks, where $t_0$ may the period of the basic clock.

At block S203, when a predetermined event occurs, a timing result of the predetermined event may be obtained according to the output value of the Gray code count, outputs of the m number of sub-clocks, a period of the basic clock, and the α.

In an example, the timing result may be a time interval from a start time to the occurrence time of the predetermined event.

In general, at the beginning of the start time (e.g., the timing procedure may be started), the Gray code count output and the outputs of the m number of sub-clocks may be cleared to zero. When the predetermined event occurs, the Gray code count output and the outputs of the m number of sub-clocks may be latched. After that, the timing result may be obtained according to the latched output value of the Gray code count, the latched outputs of the m number of sub-clocks, the period of the basic clock, and the α. In another example, because current machine language may usually only recognize binary values, a binary output value may be obtained as the output value of the Gray code count according to the Gray code count output.

In an example in accordance with the disclosure, the timing result may be expressed by a product of a total count value and a minimum timing unit, where the minimum timing unit (e.g., the timing accuracy) may be expressed as:

$$\Delta t = t_0 \times \alpha/90°$$

The total count value may be a sum of a timing clock count value and a sub-clock count value (denoted as X). In the following description, an example may be used to explain how to obtain the timing clock count value and the sub-clock count value X.

Figure 7:
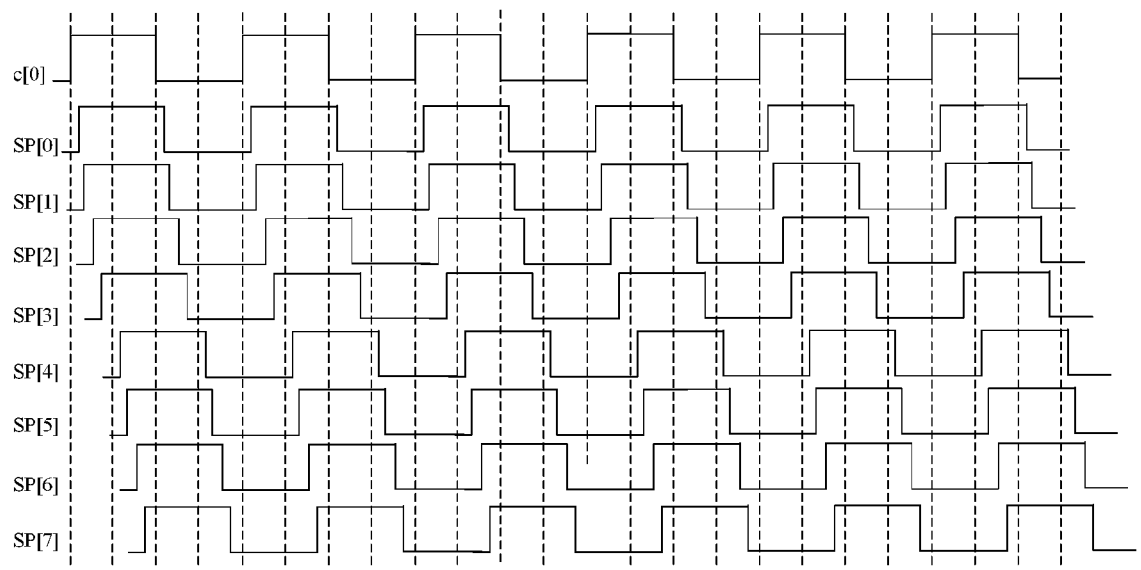
FIG. 7 is a waveform diagram showing waveforms of a least significant bit output of the Gray code count output and 8 sub-clocks.

Assume α=18°, that is, the phase shifts with 18°, 36°, 54°, 72°, 108°, 126°, 144° and 162° may be separately performed on the least significant bit output of the Gray code count so as to obtain 8 sub-clocks. When the output values of the Gray code count are 0, 1, 2, 3, respectively, the outputs of the 8 sub-clocks SP[0], SP[1], SP[2], SP[3], SP[4], SP[5], SP[6], and SP[7] may be shown as Table-1 below, where "1" may represent a high-level output and "0" may represent a low-level output. Further, the waveforms of the outputs of the 8 sub-clocks SP[0], SP[1], SP[2], SP[3], SP[4], SP[5], SP[6], and SP[7] may be as shown in FIG. 7.

count value may be equal to a product of B and 5, and the timing result may be $(B \times 5 + X) \times \Delta t$. If a reminder obtained through dividing B by 4 is 0, X may be equal to the number of SP with a high-level output, where SP may be the outputs of the 8 sub-clocks (e.g., SP[0] to SP[7]). If the reminder obtained through dividing B by 4 is 1, X may be equal to the number of SP with a high-level output minus 4. If the reminder obtained through dividing B by 4 is 2, X may be equal to 8 minus the number of SP with a high-level output. If the reminder is 3, X may be equal to 4 minus the number of SP with a high-level output.

Therefore, a common expression of the timing result may be expressed as:

$$(B \times 90°/\alpha + X) \times \Delta t.$$

Here, B may indicate the output value of the Gray code count, and X may indicate the sub-clock count value. If a remainder obtained through dividing B by 4 is 0, X may indicate a number of SP with a high-level output. If the remainder obtained through dividing B by 4 is 1, X may indicate a difference between the number of SP with the high-level output and i. If the remainder obtained through dividing B by 4 is 2, X may indicate a difference between a product of 2×i and the number of SP with the high-level output. If the reminder obtained through dividing B by 4 is 3, X may indicate that a difference between i and the number of SP with the high-level output. Here, SP may indicate the outputs of the m number of sub-clocks, i may be a smallest integer greater than or equal to 90°/α−1, $\Delta t_0 = \alpha/90°$, and $t_0$ may be the period of the basic clock.

In an example, the output value B may be generally a binary output value, and thus the Gray code count output may be converted into a binary count output, thereby obtaining the binary output value B. For example, if the Gray code count output has 32 bits, the conversion manner for converting the Gray code count output into the binary count output may be implemented by sequentially executing the following 5 conversion formulas:

$$BC = GC^{\wedge}(GC >> 1);$$

$$BC = BC^{\wedge}(BC >> 2);$$

$$BC = BC^{\wedge}(BC >> 4);$$

$$BC = BC^{\wedge}(BC >> 8);$$

$$BC = BC^{\wedge}(BC >> 16).$$

Here, BC may indicate the binary count output, and GC may indicate the Gray code count output.

TABLE 1

| | Output values (B) | | | | | | | | | | | | | | | | | | | |
|---|---|---|---|---|---|---|---|---|---|---|---|---|---|---|---|---|---|---|---|---|
| | 0 | | | | | 1 | | | | | 2 | | | | | 3 | | | | |
| SP[7] | 0 | 0 | 0 | 0 | 0 | 0 | 0 | 0 | 0 | 1 | 1 | 1 | 1 | 1 | 1 | 1 | 1 | 1 | 1 | 0 |
| SP[6] | 0 | 0 | 0 | 0 | 0 | 0 | 0 | 0 | 1 | 1 | 1 | 1 | 1 | 1 | 1 | 1 | 1 | 1 | 0 | 0 |
| SP[5] | 0 | 0 | 0 | 0 | 0 | 0 | 0 | 1 | 1 | 1 | 1 | 1 | 1 | 1 | 1 | 1 | 0 | 0 | 0 | 0 |
| SP[4] | 0 | 0 | 0 | 0 | 0 | 0 | 1 | 1 | 1 | 1 | 1 | 1 | 1 | 1 | 1 | 0 | 0 | 0 | 0 | 0 |
| SP[3] | 0 | 0 | 0 | 0 | 1 | 1 | 1 | 1 | 1 | 1 | 1 | 1 | 1 | 0 | 0 | 0 | 0 | 0 | 0 | 0 |
| SP[2] | 0 | 0 | 0 | 1 | 1 | 1 | 1 | 1 | 1 | 1 | 1 | 1 | 0 | 0 | 0 | 0 | 0 | 0 | 0 | 0 |
| SP[1] | 0 | 0 | 1 | 1 | 1 | 1 | 1 | 1 | 1 | 1 | 1 | 0 | 0 | 0 | 0 | 0 | 0 | 0 | 0 | 0 |
| SP[0] | 0 | 1 | 1 | 1 | 1 | 1 | 1 | 1 | 1 | 1 | 0 | 0 | 0 | 0 | 0 | 0 | 0 | 0 | 0 | 0 |
| X | 0 | 1 | 2 | 3 | 4 | 0 | 1 | 2 | 3 | 4 | 0 | 1 | 2 | 3 | 4 | 0 | 1 | 2 | 3 | 4 |

As can be seen from Table-1, whenever the output value (denoted as B) of the Gray code count is changed by 1, it may correspond to 5 counts. Therefore, the timing clock In addition to the above-described conversion manner, a look-up table or simple operations (such as an addition operation) may be adopted for converting the Gray code count output into the binary count output in an example in accordance with the disclosure.

In an example in accordance with the disclosure, the sub-clock count value X may be obtained by searching a look-up table. For example, the result of X may be obtained by searching Table-1, or the result of X may be obtained by using a calculating manner. An alternative calculating manner for calculating the sub-clock count value X may be specified below.

Figure 4:
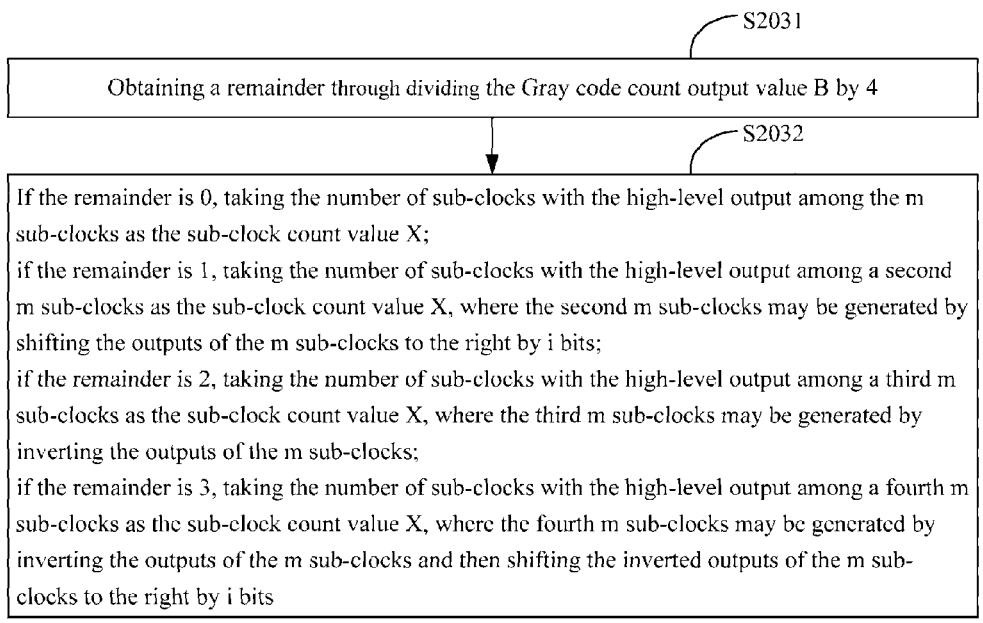
FIG. 4 is a flowcharting illustrating an operating procedure of the block S203 shown in FIG. 2 according to an example in accordance with the disclosure.

Referring to FIG. 4, which is a flowchart illustrating an operating procedure of the block S203 shown in FIG. 2 according to an example in accordance with the disclosure. The block S203 may include the sub-blocks S2031 and S2032.

At sub-block S2031, a remainder may be obtained through dividing the output value of the Gray code count by 4.

At sub-block S2032, the sub-clock count value may be determined according to the remainder and the outputs of the m number of sub-clocks, which may include the following.

If the remainder is 0, the number of sub-clocks among the m number of sub-clocks with a high-level output may be taken as the sub-clock count value X.

If the remainder is 1, the number of sub-clocks with a high-level output among a second set of m number of sub-clocks may be taken as the sub-clock count value X, where the second m number of sub-clocks may be generated by shifting the outputs of the m number of sub-clocks to the right by i number of bits, where i is a smallest integer greater than or equal to $90°/\alpha-1$.

If the remainder is 2, the number of sub-clocks with the high-level output among a third set of m number of sub-clocks may be taken as the sub-clock count value X, wherein the third set of m number of sub-clocks may be generated by inverting the outputs of the m number of sub-clocks.

If the remainder is 3, the number of sub-clocks with the high-level output among a fourth set of m number of sub-clocks may be taken as the sub-clock count value X, wherein the fourth set of m number of sub-clocks may be generated by inverting the outputs of the m number of sub-clocks and then shifting the inverted outputs of the m number of sub-clocks to the right by i number of bits.

For example, assuming $\alpha=18°$. If the remainder is 0, the number of SP with a high-level output among the outputs of the 8 sub-clocks may be obtained as the sub-clock count value X. If the remainder is 1, the number of SP with a high-level output may be obtained as X by shifting the SP to the right by 4 bits. If the remainder is 2, the number of SP with a high-level output may be obtained as X by inverting the SP. If the remainder is 3, the number of SP with a high-level output may be obtained as X by inverting the SP and then shifting the inverted SP to the right by 4 bits. Here, DP may be obtained by processing the SP in a unified manner, and then X may be obtained by merely calculating the number of DP with a high-level output. The above-described unified manner may be implemented by sequentially executing the following two formulas:

$$Rem = B \& 0x03; \text{ and}$$

$$DP = (SP \,\hat{}\, \{4 \times Rem[1]\}) >> (Rem[0] << 2).$$

Here, Rem[0] may represent the $0^{th}$ bit of Rem, Rem[1] may represent the $1^{st}$ bit of Rem, and "<<" may represent a left shift operation.

The number of DP with a high-level output (e.g, X) may be calculated by sequentially executing the following 3 formulas:

$$X = DP;$$

$$X = (X \& 0x5) + ((X >> 1) \& 0x5); \text{ and}$$

$$X = (X \& 0x3) + ((X >> 2) \& 0x3).$$

As can be known from the above examples, the Gray code count output may be obtained by performing the Gray code count on the basic clock in the present disclosure. Then m number of sub-clocks may be obtained by separately performing a phase shift on the least significant bit output of the Gray code count output, where the phase difference φ between each sub-clock among the m number of sub-clocks and the least significant bit output may be $\varphi=n \times \alpha$, $\varphi \neq 90°$, and n may be an integer greater than 0 and less than $180°/\alpha$. If $90°$ is divisible by $\alpha$ with no remainder, $m=180/\alpha-2$; and if $90°$ is divisible by a with a remainder, $m=180/\alpha-1$. When a predetermined event occurs, a timing result of the predetermined event may be obtained according to the Gray code count output value, outputs of the m number of sub-clocks, a period of the basic clock, and the $\alpha$.

As can be seen from the examples of the present disclosure, a count may be only performed on the basic clock without performing a count on the plurality of sub-clocks, which may reduce the number of the counting modules, and may reduce hardware resources. At the same time, the original binary count may not be adopted anymore in the above examples of the present disclosure, while the Gray code count may be adopted, and thus simultaneous transitions at a plurality of bit outputs of the Gray code count won't occur. The phase difference between the m number of sub-clocks and the least significant bit output may be ensured, simultaneous transitions won't occur in the outputs of the m number of sub-clocks and the Gray code count output. In an example, only one bit between two adjacent bits of the Gray code count output may be changed during transition, which may reduce logic confusion from one state to a next state, and may improve timing accuracy.

The method of the present disclosure may be applied to a PET system, for example, a timing procedure may be performed on an arrival time of a photon at a detector. Hence, the predetermined event may be a detection of a photon reaching the detector.

Figure 5:
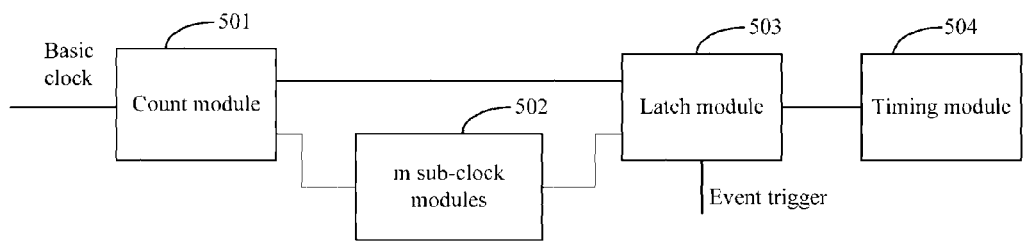
FIG. 5 is an architecture diagram of a timing device according to an example in accordance with the disclosure.

In accordance with the above-described timing method provided in the above examples, a timing device may be provided in an example in accordance with the disclosure. The timing device may be applied in electronic devices such as FPGA or CPLD. As shown in FIG. 5, the timing device may include a count module 501, m sub-clock modules 502, a latch module 503, and a timing module 504.

The count module 501 may be used to obtain a Gray code count output by performing a Gray code count on a basic clock.

In an example, a binary count may be not adopted anymore, while a Gray code count may be adopted for obtaining the Gray code count output, which may ensure that simultaneous transitions won't occur at a plurality of outputs of the Gray code count output.

In an example, the basic clock may be a clock signal obtained by performing a frequency multiplication on an original clock. Whether the frequency multiplication is required or not may be depended on the timing accuracy. The original clock may be obtained through the clock input module 110 shown in FIG. 1.

Figure 6:
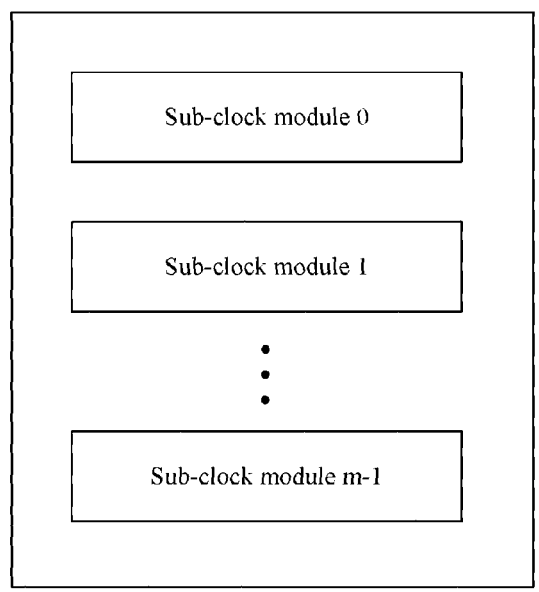
FIG. 6 is an architecture diagram of m sub-clock modules according to an example in accordance with the disclosure.

The m number of sub-clock modules 502 may be used to obtain m number of sub-clocks by separately performing a phase shift on a least significant bit output of the Gray code count output. The m number of sub-clock modules are shown in FIG. 6, which may include the sub-clock module 0, the sub-clock module 1, . . . , and the sub-clock module m−1.

Here a phase difference φ between each of the m number of sub-clocks and the least significant bit output may satisfy φ=n×α and φ≠90°, where 180° may be divisible by α with no remainder, and n may be an integer greater than 0 and less than 180°/α. If 90° is divisible by α with no remainder, m=180/α−2; and if 90° is divisible by α with a remainder, m=180/α−1.

The latch module 503 may be used to latch the Gray code count output and outputs of the m number of sub-clocks when a predetermined event occurs. The timing device in an example may be applied in a PET system, for example, a timing procedure may be performed on an arrival time of a photon at a detector. Hence, the predetermined event may be a detection of a photon reaching the detector.

The timing module 504 may be used to obtain a timing result of the predetermined event according to the Gray code count output value latched by the latch module 503, the outputs of the m number of sub-clocks latched by the latch module 503, a period of the basic clock, and the α.

In an example, the timing result may be the time interval from a start time to the occurrence time of the predetermined event. In general, at the beginning of the start time (e.g., the timing procedure may be started), the Gray code count output and the outputs of the m number of sub-clocks may be cleared to zero. Therefore, the timing result of the predetermined event may be obtained according to the output value of the Gray code count and the outputs of the m number of sub-clocks when the predetermined event occurs, the period of the basic clock, and the α.

In an example, the timing result may be (B×90°/α+X)×Δt. Here, B may indicate the output value of the Gray code count, and X may indicate the sub-clock count value. If a remainder obtained through dividing B by 4 is 0, X may equal to a number of SP with a high-level output, and SP may indicate the outputs of the m number of sub-clocks. If the remainder obtained through dividing B by 4 is 1, X may equal to a difference between the number of SP with the high-level output and i. If the remainder obtained through dividing B by 4 is 2, X may equal to a difference between a product of 2×i and the number of SP with the high-level output. Here, i may be a smallest integer greater than or equal to 90°/α−1, Δt=$t_0$×α/90°, and $t_0$ may be the period of the basic clock.

In an example in accordance with the disclosure, the Gray code count output may be obtained by performing the Gray code count on the basic clock. Two alternative methods of generating the Gray code count output may be provided below.

In a first method of generating the Gray code count output, the count module 501 may include a count sub-module and a conversion sub-module. The count sub-module may be used to perform an original binary count on the basic clock so as to obtain an original binary count output. The conversion sub-module may be used to convert the original binary count output into the Gray code count output. Here, the converting method for converting the original binary count output into the Gray code count output may be GC=BC^(BC>>1), where BC may indicate the original binary count output, GC may indicate the Gray code count output, "^" may indicate an "XOR" operation, and ">>" may indicate a right shift operation.

In a second method of generating the Gray code count output, the count module 501 may include a frequency division and delay sub-module. The frequency division and delay sub-module may be used to perform a frequency division and a delay on the basic clock so as to obtain the Gray code count output. Here, a frequency division sub-module may be used to perform a frequency division on the basic clock so as to obtain a plurality of frequency division outputs, and then a delay sub-module may be used to perform a delay procedure on the plurality of frequency division outputs so as to obtain the Gray code count output.

In an example in accordance with the disclosure, the timing module 504 may obtain the sub-clock count value X by searching a lookup table. The lookup table may comprise the sub-clock count value X and the Gray code count output value. For example, the result of X may be obtained by searching Table-1; or the sub-clock count value X may be obtained through calculations, which may be specifically described below.

The operations of the timing module 504 for obtaining the sub-clock count value X through calculations may include. A remainder may be obtained through dividing the Gray code count output value B by 4. The sub-clock count value X may be determined according to the remainder and the outputs of the m number of sub-clocks. For example, if the remainder is 0, the number of sub-clocks with the high-level output among the m number of sub-clocks may be taken as the sub-clock count value X; if the remainder is 1, the number of sub-clocks with the high-level output among a second m number of sub-clocks may be taken as the sub-clock count value X, where the second m number of sub-clocks may be generated by shifting the outputs of the m number of sub-clocks to the right by i number of bits; if the remainder is 2, the number of sub-clocks with the high-level output among a third m number of sub-clocks may be taken as the sub-clock count value X, where the third m number of sub-clocks may be generated by inverting the outputs of the m number of sub-clocks; and if the remainder is 3, the number of sub-clocks with the high-level output among a fourth m number of sub-clocks may be taken as the sub-clock count value X, where the third m number of sub-clocks may be generated by inverting the outputs of the m number of sub-clocks and then shifting the inverted outputs of the m number of sub-clocks to the right by i number of bits.

Although the flowcharts described show a specific order of execution, the order of execution may differ from that which is depicted. For example, the order of execution of two or more blocks may be changed relative to the order shown. Also, two or more blocks shown in succession may be executed concurrently or with partial concurrence. All such variations are within the scope of the present disclosure.

For simplicity and illustrative purposes, the present disclosure is described by referring mainly to examples therein. In the above description, numerous specific details are set forth in order to provide a thorough understanding of the present disclosure. It will be readily apparent however, that the present disclosure may be practiced without being limited to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Throughout the present disclosure, the word "comprise", or variations such as "comprises" or "comprising", will be understood to imply the inclusion of a stated element, integer or step, or group of elements, integers or steps, but not the exclusion of any other element, integer or step, or group of elements, integers or steps.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A timing method, comprising:
   obtaining a Gray code count output by performing a Gray code count on a basic clock;
   obtaining m number of sub-clocks by separately performing a phase shift on a least significant bit output of the Gray code count output, wherein a phase difference φ between each of the m number of sub-clocks and the least significant bit output satisfies: φ=n×α and φ≠90°, wherein, 180° is divisible by α with no remainder, and n is an integer greater than 0 and less than 180°/α;
   when 90° is divisible by α with no remainder, m=180/α−2,
   when 90° is divisible by α with a remainder, m=180/α−1; and
   obtaining a timing result of a predetermined event according to the Gray code count output value, outputs of the m number of sub-clocks, a period of the basic clock, and the α when the predetermined event occurs.

2. The method according to claim 1, wherein obtaining the timing result comprises:
   obtaining a sub-clock count value; and
   determining the timing result according to a formula as follows:

(B×90°/α+X)×Δt;

wherein B is a Gray code count output value,
   X is the sub-clock count value,
   when a remainder obtained through dividing B by 4 is 0, X is equal to a number of sub-clocks with a high-level output among the m number of sub-clocks,
   when the remainder obtained through dividing B by 4 is 1, X is equal to a difference between the number of sub-clocks with the high-level output among the m number of sub-clocks and i,
   when the remainder obtained through dividing B by 4 is 2, X is equal to a difference between a product of 2×i and the number of sub-clocks with the high-level output among the m number of sub-clocks,
   when the remainder obtained through dividing B by 4 is 3, X is equal to a difference between i and the number of sub-clocks with the high-level output among the m number of sub-clocks,
   i is a smallest integer greater than or equal to 90°/α−1, Δt=$t_0$×α/90°, and $t_0$ is the period of the basic clock.

3. The method according to claim 2, wherein obtaining the sub-clock count value X comprises:
   obtaining a remainder through dividing the Gray code count output value B by 4;
   when the remainder is 0, taking the number of sub-clocks with the high-level output among the m number of sub-clocks as the sub-clock count value X;
   when the remainder is 1, taking the number of sub-clocks with the high-level output among a second set of m number of sub-clocks as the sub-clock count value X, wherein the second set of m number of sub-clocks are generated by shifting the outputs of the m number of sub-clocks to the right by i number of bits;
   if the remainder is 2, taking the number of sub-clocks with the high-level output among a third set of m number of sub-clocks as the sub-clock count value X, wherein the third set of m number of sub-clocks are generated by inverting the outputs of the m number of sub-clocks; and
   if the remainder is 3, taking the number of sub-clocks with the high-level output among a fourth set of m number of sub-clocks as the sub-clock count value X, wherein the fourth set of m number of sub-clocks are generated by inverting the outputs of the m number of sub-clocks and then shifting inverted outputs of the m number of sub-clocks to the right by i number of bits.

4. The method according to claim 2, wherein obtaining the sub-clock count value X comprises:
   obtaining the sub-clock count value by searching a lookup table,
   wherein the lookup table comprises the sub-clock count value X and the Gray code count output value.

5. The method according to claim 1, wherein obtaining the Gray code count output by performing the Gray code count on the basic clock comprises:
   obtaining an original binary count output by performing an original binary count on the basic clock; and
   converting the original binary count output into the Gray code count output.

6. The method according to claim 1, wherein obtaining the Gray code count output by performing the Gray code count on the basic clock comprises:
   obtaining the Gray code count output by performing a frequency division and a delay on the basic clock.

7. A timing device, comprising:
   a count module configured to obtain a Gray code count output by performing a Gray code count on a basic clock;
   m number of sub-clock modules respectively configured to obtain a sub-clock by performing a phase shift on a least significant bit output of the Gray code count output, wherein a phase difference φ between each of the m number of sub-clocks and the least significant bit output satisfies: φ=n×α and φ≠90°, wherein 180° is divisible by α with no remainder, and n is an integer greater than 0 and less than 180°/α;
   when 90° is divisible by a with no remainder, m=180/α−2,
   when 90° is divisible by a with no remainder, m=180/α−1;
   a latch module configured to latch the Gray code count output and outputs of m number of sub-clocks obtained by the m number of sub-clock modules when a predetermined event occurs; and
   a timing module configured to obtain a timing result of the predetermined event according to the Gray code count output value, outputs of the m number of sub-clocks, a period of the basic clock, and the α.

8. The timing device according to claim 7, wherein the timing result comprises:

(B×90°/α+X)×Δt;

wherein B is a Gray code count output value,
   X is a sub-clock count value,
   when a remainder obtained through dividing B by 4 is 0, X is equal to a number of sub-clocks with a high-level output among the m number of sub-clocks, when the remainder obtained through dividing B by 4 is 1, X is equal to a difference between the number of sub-clocks with the high-level output among the m number of sub-clocks and i, when the remainder obtained through dividing B by 4 is 2, X is equal to a difference between a product of 2×i and the number of sub-clocks with the high-level output among the m number of sub-clocks, when the remainder obtained through dividing B by 4 is 3, X is equal to a difference between i and the number of sub-clocks with the high-level output among the m number of sub-clocks, i is a smallest integer greater than or equal to $90°/\alpha-1$, $\Delta t = t_0 \times \alpha/90°$, and $t_0$, is the period of the basic clock.

9. The timing device according to claim 8, wherein the timing module is configured to:
  obtain a remainder through dividing the Gray code count output value B by 4;
  when the remainder is 0, take the number of sub-clocks with the high-level output among the m number of sub-clocks i as the sub-clock count value X;
  when the remainder is 1, take the number of sub-clocks with the high-level output among a second set of m number of sub-clocks as the sub-clock count value X, wherein the second set of m number of sub-clocks are generated by shifting the outputs of the m number of sub-clocks to the right by i number of bits;
  when the remainder is 2, take the number of sub-clocks with the high-level output among a third set of m number of sub-clocks as the sub-clock count value X, wherein the third set of m number of sub-clocks are generated by inverting the outputs of the m number of sub-clocks; and
  when the remainder is 3, take the number of sub-clocks with the high-level output among a fourth set of m number of sub-clocks as the sub-clock count value X, wherein the fourth set of m number of sub-clocks are generated by inverting the outputs of the m number of sub-clocks and then shifting inverted outputs of the m number of sub-clocks to the right by i number of bits.

10. The timing device according to claim 8, wherein the timing module obtains the sub-clock count value X by searching a lookup table, wherein the lookup table comprises the sub-clock count value X and the Gray code count output value.

11. The timing device according to claim 7, wherein the timing module comprises:
  a count sub-module configured to obtain an original binary count output by performing an original binary count on the basic clock; and
  a conversion sub-module configured to convert the original binary count output into the Gray code count output.

12. The timing device according to claim 7, wherein the timing module comprises:
  a frequency division and delay sub-module configure to obtain the Gray code count output by performing a frequency division and a delay on the basic clock.

* * * * *